United States Patent [19]

Kojima et al.

[11] 4,063,185

[45] Dec. 13, 1977

[54] DIRECT COUPLING TYPE POWER AMPLIFIER CIRCUIT

[75] Inventors: Shinichi Kojima, Mitaka; Yoshio Sakamoto, Kokubunji, both of Japan

[73] Assignee: Hitachi, Ltd, Japan

[21] Appl. No.: 766,725

[22] Filed: Feb. 8, 1977

[30] Foreign Application Priority Data

Feb. 25, 1976 Japan .................................. 51-18990

[51] Int. Cl.$^2$ ............................................. H03F 3/04
[52] U.S. Cl. .................................... 330/255; 330/259; 330/261; 330/199; 330/207 P
[58] Field of Search .................. 325/186, 492; 330/22, 330/40, 28, 30 D, 141, 199, 207 P; 358/190

[56] References Cited

U.S. PATENT DOCUMENTS

| | | | |
|---|---|---|---|
| 2,585,890 | 2/1952 | Wolfe | 330/141 X |
| 3,706,852 | 12/1972 | Angus | 330/141 X |

*Primary Examiner*—Lawrence J. Dahl
*Attorney, Agent, or Firm*—Craig & Antonelli

[57] ABSTRACT

In a direct coupling type power amplifier circuit comprising an input differential amplifier stage, a drive amplifier stage responsive to the output signal of the input differential amplifier stage dc-wise and ac-wise, and a push-pull output amplifier stage responsive to the output signal of the drive amplifier stage dc-wise and ac-wise, the input differential amplifier stage being supplied at one input electrode thereof with an input signal and at the other input electrode thereof with the output of the push-pull output amplifier stage through a negative feedback circuit network, the power amplifier circuit further comprises a bias circuit network for defining the dc bias current through the input differential amplifier stage and a delay circuit coupled between the bias circuit network and a power source voltage supply point. With this circuit arrangement, the dc bias current through the input differential amplifier stage is cut off to hold the whole power amplifier circuit non-responsive to the input signal during a predetermined time internal after the application of the power source voltage to the power source voltage supply point, the predetermined time interval being substantially determined by a predetermined delay time in the delay circuit and a predetermined constant voltage value of a constant voltage circuit component in the bias circuit network.

19 Claims, 7 Drawing Figures

DIRECT COUPLING TYPE POWER AMPLIFIER CIRCUIT

BACKGROUND OF THE INVENTION

1. Field of the Invention

The present invention relates to a direct coupling type power amplifier for use with audio circuits and more particularly to such a direct coupling type power amplifier having a muting function.

2. Description of the Prior Art

In a typical type of audio power amplifier circuit for amplifying audio signals, an inpact or popping sound unpleasant to the ears is sometimes generated from its load speaker immediately after the power source is turned on, due to a rapid change in bias voltages in a preamplifier such as an equalizer used in a first input amplifier stage of the power amplifier circuit. The impact sound is not only unpleasant to the ears, but also exposes the speaker to the danger of being damaged.

There has been provided a power amplifier circuit free from the generation of impact or popping sounds, in which a muting function is provided by breaking a signal transfer path through the actuation of an electromagnetic relay for a certain time interval after the turn-on of the power source. However, such a power amplifier circuit is expensive since the electromagnetic relay used therein is rather costly and moreover the switching sound of the relay is felt to be unpleasant.

SUMMARY OF THE INVENTION

The present invention is made to solve the above problems and its object is to provide a direct coupling type power amplifier circuit which has a muting function and is inexpensive.

The present invention is directed to a direct coupling type power amplifier circuit comprising an input differential amplifier stage, a drive amplifier stage responsive to the ouput signal of the input differential amplifier stage dc-wise or ac-wise, and a push-pull output amplifier stage responsive to the output signal of the drive amplifier stage dc-wise and ac-wise, the input differential amplifier stage being supplied at one input electrode thereof with an input signal and at the other input electrode thereof with the output of the push-pull output amplifier stage through a negative feedback circuit network. The direct coupling type power amplifier circuit according to the present invention further comprises a bias circuit network for defining the dc bias current through the input differential amplifier stage and a delay circuit means coupled between the bias circuit network and a power source voltage supply point. With this circuit arrangement, the dc bias current through the input differential amplifier stage is cut off to hold the whole power amplifier circuit non-responsive to the input signal during a predetermined time interval after the application of the power source voltage to the power source voltage supply point, the predetermined time interval being substantially determined by a predetermined delay time in the delay circuit means and a predetermined constant voltage value of the constant voltage circuit component in the bias circuit network. Thus, the whole power amplifier circuit performs a muting function.

DESCRIPTION OF THE PREFERRED EMBODIMENTS

Figure 1:
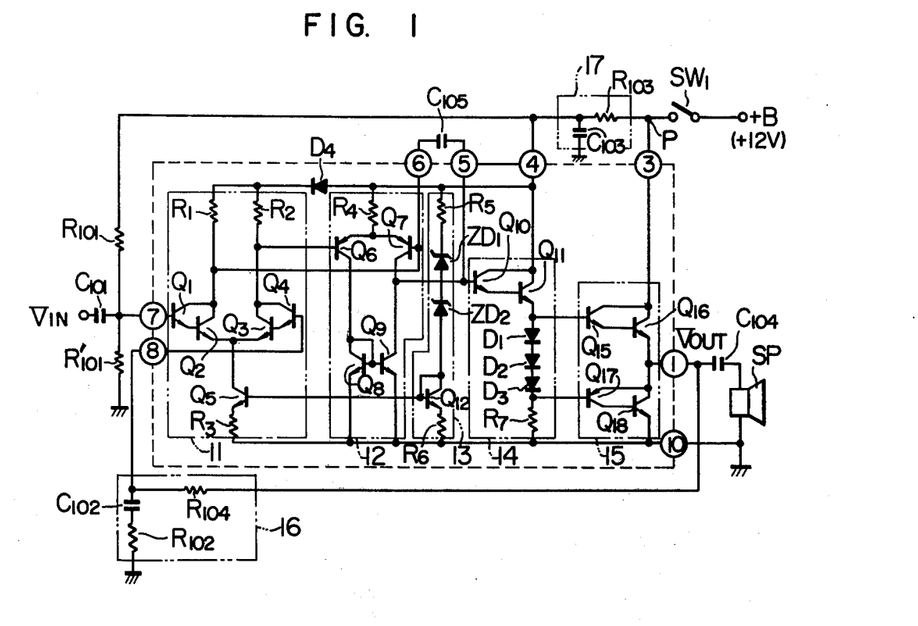
FIG. 1 shows a direct coupling type power amplifier circuit according to one embodiment of the present invention.

In FIG. 1 showing a direct coupling type power amplifier circuit fabricated in monolithic semiconductor integrated circuit configuration according to one embodiment of the present invention, all circuit elements enclosed in the rectangle of dashed line are formed in one semiconductor chip according to well-known techniques and circled numerals indicate the terminal or pin numbers of the integrated circuit.

An input differential amplifier stage 11 includes a differential pair of NPN type transistors ($Q_1$, $Q_2$) and ($Q_3$, $Q_4$). The transistors $Q_1$ and $Q_2$ are connected in Darlington configuration and the transistors $Q_3$ and $Q_4$ are connected similarly. The emitter electrodes of the transistors $Q_2$ and $Q_3$ are connected with each other and also with the collector electrode of a transistor $Q_5$ serving as a first constant current source. The base electrode of the transistor $Q_1$ receives an input signal $V_{IN}$ through a pin 7 and an input coupling capacitor $C_{101}$ and the base electrode of the transistor $Q_4$ receives the output signal $V_{OUT}$ of a push-pull amplifier stage 15 through a pin 8 and a negative feedback circuit network 16. The collector electrodes of the transistors $Q_1$ and $Q_2$ are connected with each other and also with one end of a first collector load resistor $R_1$. The collector electrodes of the transistors $Q_3$ and $Q_4$ are connected with each other and also with one end of a second collector load resistor $R_2$. The other ends of the first and the second collector load resistors $R_1$ and $R_2$ are connected with each other. The emitter electrode of the first constant current source transistor $Q_5$ is connected with a ground potential point through a resistor $R_3$ and a pin 10.

A differential cascade amplifier stage 12 includes a differential pair of PNP type transistors $Q_6$ and $Q_7$. The base electrodes of the PNP type transistors $Q_6$ and $Q_7$ are connected respectively with the second and first collector load resistors $R_2$ and $R_1$ so that the differential cascade amplifier stage 12 responds to the output of the input differential amplifier stage 11 irrespective of whether the output is of dc or ac. The emitter electrodes of the transistors $Q_6$ and $Q_7$ are connected with each other and also with one end of a common emitter resistor $R_4$. The junction point of the first and second collector load resistors $R_1$ and $R_2$ is connected with the other end of the resistor $R_4$ through a PN junction type diode $D_4$ for compensating the temperature characteristics of the base-emitter junctions of the transistors $Q_6$ and $Q_7$. The collector electrodes of the transistors $Q_6$ and $Q_7$ are connected respectively with the collector electrodes of load transistors $Q_8$ and $Q_9$. The base electrodes of the load transistors $Q_8$ and $Q_9$ are connected with each other and also with the collector electrodes of the load transistor $Q_8$. The emitter electrodes of the transistors $Q_6$ and $Q_7$ are connected through the pin 10 with the ground potential point.

A drive amplifier stage 14 includes Darlington-connected NPN type transistors $Q_{10}$ and $Q_{11}$ which serve as emitter-follower amplifier means. The base electrode of the transistor $Q_{10}$ is connected with the collector of the load transistor $Q_9$ in the differential cascade amplifier stage 12 so that the drive amplifier stage 14 responds to the output signal of the differential cascade amplifier stage 12 dc-wise and ac-wise, i.e. irrespective of whether the output is of dc or ac. The emitter electrode of the emitter-follower amplifer transistor $Q_{11}$ is connected with the base electrode of the transistor $Q_{15}$ in the push-pull output stage 15 and also with a resistor $R_7$ and the base electrode of the transistor $Q_{17}$ of the push-pull output amplifier stage 15 through forward series-connected PN junction type diodes $D_1$, $D_2$ and $D_3$ for lowering cross-over distortion. The push-pull output amplifier stage 15 includes Darlington-connected transistors $Q_{15}$ and $Q_{16}$ and complementary transistors $Q_{17}$ and $Q_{18}$. The push-pull output amplifier stage 15 responds to the output of the drive amplifier stage 14 dc-wise and ac-wise, i.e. irrespective of whether the output is of dc or ac, and delivers a push-pull output signal $V_{OUT}$ through a pin 1. The output signal $V_{OUT}$ is supplied to a speaker SP as a load through an output coupling capacitor $C_{104}$ for blocking a dc component and also to the pin 8 through the negative feedback circuit network 16 constituted of resistors $R_{102}$ and $R_{104}$ and a capacitor $C_{102}$.

A first power source voltage $+B$ is applied to a first power source voltage supply point P through a power switch $SW_1$ and also applied as a drive voltage to the push-pull output amplifier stage 15 through a pin 3. The source voltage $+B$ through the power switch $SW_1$ is further applied to a pin 4 through a delay circuit or power source ripple eliminating filter circuit 17 including a resistor $R_{103}$ and a capacitor $C_{103}$, so that a stabilized operation voltage is applied to the input differential amplifier stage 11, the differential cascade amplifier stage 12, a bias circuit network 13 and the drive amplifier stage 14. The stable operation voltage derived from the delay circuit or power source ripple eliminating filter circuit 17 is divided by voltage dividing resistors $R_{101}$ and $R_{101}'$ connected in series and the divided voltage is applied to the base electrode of the transistor $Q_1$ in the input differential amplifier stage 11. The collector electrode and base electrode of the transistor $Q_7$ in the differential cascade amplifier stage 12 are connected with each other through an oscillation preventing capacitor $C_{105}$ which provides an ac negative feedback function and is connected between pins 5 and 6. As a result, the differential cascade amplifier stage 12 is provided with a phase compensating function.

In this embodiment shown in FIG. 1, the bias network 13 is in the form of a series circuit of a bias resistor $R_5$, Zener diodes $ZD_1$ and $ZD_2$ (serving as constant voltage means) and a PN junction type diode or diode-functioning transistor $Q_{12}$ with its collector and base electrodes connected together. The emitter of the diode-functioning transistor $Q_{12}$ is connected with the ground potential point through a resistor $R_6$ and the collector and base electrodes of the transistor $Q_{12}$ are connected in common with the base electrode of the first constant current source transistor $Q_5$ in the input differential amplifier stage 11. The thus-constructed bias circuit network 13 is connected with the first power source voltage supply point P through the delay circuit or power source ripple eliminating filter circuit 17.

The above-described embodiment of the present invention can attain the aimed object of the invention for the following reason.

When the power switch $SW_1$ is turned on, a voltage $V_4$ at the pin 4 increases exponentially according to the delay time in the delay circuit 17, i.e. the time constant $\tau (\approx R_{103}C_{103})$ of the power source ripple eliminating filter circuit 17. On the other hand, since the bias circuit network 13 has the Zener diodes $ZD_1$ and $ZD_2$ and the diode-functioning transistor $Q_{12}$, a dc bias current $I_{B13}$ does not flow through the bias circuit network 13 until the voltage $V_4$ at the pin 4 increases to satisfy the following relation (1).

$$V_4 \gtreqqless V_{ZD_1} + V_{ZD_2} + V_{BEQ_{12}} \tag{1}$$

Here, $V_{ZD_1}$ and $V_{ZD_2}$ are the breakdown voltages across the Zener diodes $ZD_1$ and $ZD_2$ and $V_{BEQ_{12}}$ is the forward voltage drop across the base-emitter junction of the diode-functioning transistor $Q_{12}$. After the voltage $V_4$ at the pin 4 has sufficiently increased to satisfy the relation (1), the dc bias current $I_{B13}$ determined by the following relation (2) flows through the bias circuit network 13.

$$I_{B13} = \frac{V_4 - (V_{ZD_1} + V_{ZD_2} + V_{BEQ_{12}})}{R_5 + R_6} \tag{2}$$

Accordingly, during the time interval for which the voltage $V_4$ at the pin 4 is so low as not to satisfy the relation (1) since only a very short time has lapsed after the turn-on of the power switch $SW_1$, the dc bias current $I_{B13}$ to flow through the bias circuit network 13 is zero and therefore the base of the diode-functioning transistor $Q_{12}$ is substantially kept at zero potential. Since the base electrode of the diode-functioning transistor $Q_{12}$ is connected with the base electrode of the first constant current source transistor $Q_5$, the dc bias current $I_{B11}$ of the input differential amplifier stage 11 flowing through the collector-emitter path of the first constant current source transistor $Q_5$ is zero during the time interval for which the dc bias current $I_{B13}$ through the bias circuit network 13 is zero. Consequently, while the bias current $I_{B11}$ is zero, all the differential pair of transistors ($Q_1$, $Q_2$) and ($Q_3$, $Q_4$) in the input differential amplifier stage 11 are so biased as to be cut off so that the input differential amplifier stage 11 becomes non-responsive to the input signal $V_{IN}$ applied to the pin 7 through the input coupling capacitor $C_{101}$. As a result, the following stages, i.e. the differential cascade amplifier stage 12, the drive amplifier stage 14 and the push-pull output amplifier stage 15 remain inoperative and therefore the direct coupling type power amplifier circuit as a whole is subjected to a muting effect.

Now, when the voltage $V_4$ at the pin 4 rises to satisfy the relation (1) and to cause the bias current $I_{B13}$ to start flowing through the bias network 13, the dc bias current $I_{B11}$ starts flowing through the collector-emitter path of the first constant current source transistor $Q_5$ in the input differential amplifier stage 11. Accordingly, all the differential pair of transistors ($Q_1$, $Q_2$) and ($Q_3$, $Q_4$) in the input differential amplifier stage 11 are so biassed as to be conductive so that the input differential amplifier stage 11 comes to respond to the input signal $V_{IN}$ supplied to the pin 7 and to amplify the same. As the dc bias current $I_{B11}$ flows through the input differential amplifier stage 11, voltage drops take place across the first and second collector load resistors $R_1$ and $R_2$. Accordingly, the differential pair of transistors $Q_6$ and $Q_7$ in the differential cascade amplifier stage 12 are so biassed as to be conductive so that the differential cascade amplifier stage 12 responds to the output signal of the input differential amplifier stage 11 and amplifies the same. When the dc bias current $I_{B12}$ starts flowing through the differential cascade amplifier stage 12, current flows into the base of the emitter-follower amplifier transistor $Q_{10}$ in the drive amplifier stage 14. Accordingly, the Darlington-connected emitter-follower amplifier transistors $Q_{10}$ and $Q_{11}$ are so biased as to be conductive. As a result, the dc bias current $I_{B14}$ flows through the dirve amplifier stage 14 so that the drive amplifier stage 14 comes to respond to and to amplify the output signal of the differential cascade amplifier stage 12. When the dc bias current $I_{B14}$ starts flowing through the drive amplifier stage 14, current flows into the bases of the transistors $Q_{15}$ and $Q_{17}$ in the push-pull output amplifier stage 15 so that the push-pull output amplifier stage 15 comes to respond to and to amplify the output signal of the drive amplifier stage 14.

Figure 2:
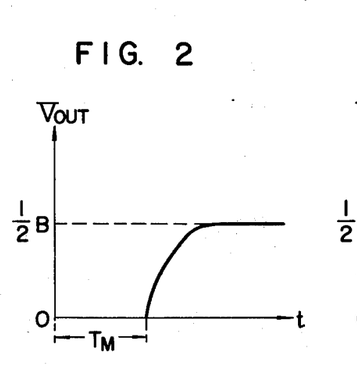
FIGS. 2 and 3 show the changes in the waveforms of the output signals of the direct coupling type power amplifier circuit shown in FIG. 1 after the turn-on of the power source voltage, FIG. 2 corresponding to the case where no input signal is applied to the power amplifier circuit and FIG. 3 corresponding to the case where an input signal is applied to the power amplifier circuit.

FIG. 2 shows the change in the output signal $V_{OUT}$ of the direct coupling type power amplifier circuit after the turn-on of the power source in the case where no input signal is applied. During a predetermined time interval $T_M$ determined substantially by the time constant $\tau$ of the power source ripple eliminating filter circuit 17 and the breakdown voltages of the Zener diodes $ZD_1$ and $ZD_2$ in the bias circuit network 13, all the stages 11, 12, 14 and 15 of the direct coupling type power amplifier circuit are so biased as to be cut off. As a result, the output signal $V_{OUT}$ at the pin 1 is substantially kept at the zero potential. After the predetermined time interval $T_M$ has lapsed, the amplifier stages 11, 12, 14 and 15 of the direct coupling type power amplifier circuit are so biased as to be sequentially turned on and therefore the power amplifier circuit performs its function of amplification. Accordingly, the power amplifier circuit comes to respond to the signal fed back through the negative feedback path from the pin 1 to the pin 8 so that the output signal $V_{OUT}$ at the pin 1 rapidly follows the potential at the pin 7. Thus, as shown in FIG. 2, the output signal $V_{OUT}$ rises up to a value of $\frac{1}{2}B$ which is half the first power source voltage +B.

Figure 3:
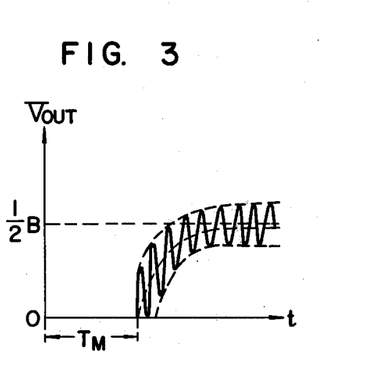

FIG. 3 shows the change in the output signal $V_{OUT}$ of the direct coupling type power amplifier circuit after the turn-on of the power source in the case where the input signal $V_{IN}$ is applied to the pin 7. As in the above-described case, the power amplifier circuit is not responsive to the input signal $V_{IN}$ applied to the pin 7 during the above-explained predetermined time interval $T_M$ so that no ac output appears at the pin 1 during that time interval $T_M$. After the lapse of the time interval $T_M$, the output signal $V_{OUT}$ rises toward $\frac{1}{2}B$ while the power amplifier circuit becomes responsive to the input signal $V_{IN}$ applied to the pin 7. As a result, an ac output in accordance with the input signal $V_{IN}$ appears at the pin 1.

Thus, according to the above-described embodiment of the present invention, the direct coupling type power amplifier circuit can perform a muting function during the predetermined time interval $T_M$ and therefore the aimed object of the present invention can be attained.

Moreover, according to this embodiment, the voltage of the output signal $V_{OUT}$ of the power amplifier circuit rises rapidly and monotonously toward the value of $\frac{1}{2}B$ after the lapse of the predetermined time interval $T_M$ so that the power amplifier circuit itself can also enjoy the merit of eliminating uneasy impact or popping sound.

The present invention is by no means limited to the above-described embodiment, but permits of numerous embodiments as variations and modifications.

Figure 4:
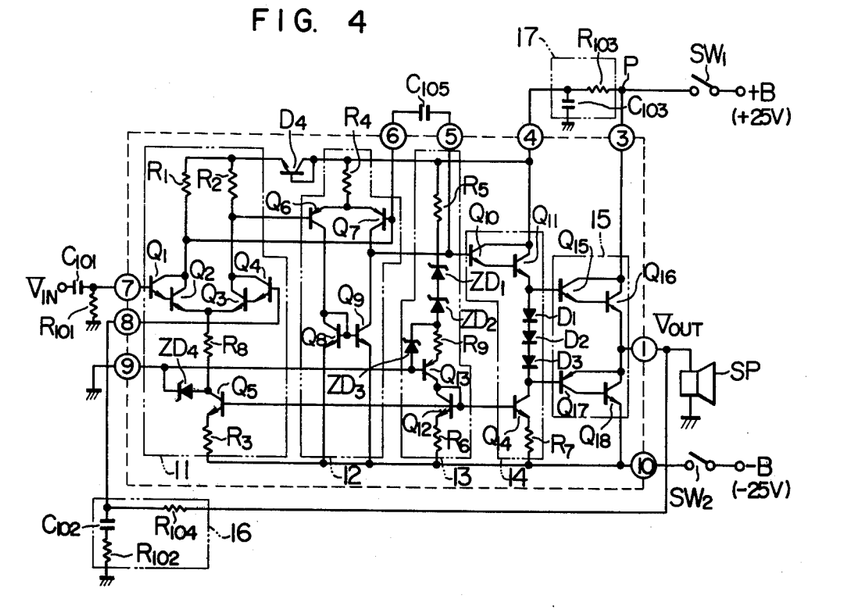
FIG. 4 shows a direct coupling type power amplifier circuit of two-power OCL (Output Condensor Less) system according to another embodiment of the present invention.

FIG. 4 shows a direct coupling type power amplifier circuit of two-power OCL (Output Condenser Less) system, fabricated in monolithic semiconductor integrated circuit configuration in accordance with another embodiment of the present invention. In FIG. 4, equivalent circuit components and blocks are designated by the same reference numerals or symbols as in FIG. 1. Since the parts already mentioned are not described again, only parts different from FIG. 1 will be detailed.

In the direct coupling type power amplifier circuit shown in FIG. 4, a second power source voltage −B having a negative polarity is applied to a second power source voltage supply point or pin 10 through a power switch $SW_2$ which is opened and closed in gang with the power switch $SW_1$ while the first power source voltage +B having a positive polarity is applied to the first power source voltage supply point P through the power switch $SW_1$. The output signal $V_{OUT}$ of the push-pull output amplifier stage 15 is directly applied to the speaker SP without using any output coupling capacitor for blocking the dc component.

The fundamental structure of the bias circuit network 13 is a series circuit of the bias resistor $R_5$, the series-connected Zener diodes $ZD_1$ and $ZD_2$, a PNP type bias transistor $Q_{13}$ and the diode-functioning transistor $Q_{12}$ with its collector and base electrodes connected together. The emitter electrode of the PNP type bias transistor $Q_{13}$ is connected with the delay circuit or power source ripple eliminating filter circuit 17 through the series connection of the resistor $R_5$ and the Zener diodes $ZD_1$ and $ZD_2$, the base electrode of the transistor $Q_{13}$ is connected with the ground potential point through a pin 9, and the collector electrode of the transistor $Q_{13}$ is connected with the diode-functioning transistor $Q_{12}$.

Further, in this embodiment, the emitter electrode of the bias transistor $Q_{13}$ is connected through a resistor $R_9$ with the series connection of the resistor $R_5$ and the Zener diodes $ZD_1$ and $ZD_2$ in order to prevent the fluctuation of the dc bias current $I_{B13}$ through the bias circuit network 13 in response to the variation of the power source voltage while the series connection of the resistor $R_9$ and the emitter-base junction of the transistor $Q_{13}$ is shunted by a Zener diode $ZD_3$ which serves as constant voltage means and improves the characteristic of voltage decrease.

A resistor $R_8$ is connected between the junction point of the emitter electrodes of the transistors $Q_2$ and $Q_3$ in the input differential amplifier stage and the collector electrode of the first constant current source transistor $Q_5$, and the collector electrode of the transistor $Q_5$ is connected with the ground potential point through a Zener diode $ZD_4$ which serves constant voltage means and to eliminate the ripple component in the power source, and through the pin 9. Therefore, the input differential amplifier stage 11 is almost non-responsive to the ripple component in the second power source voltage $-B$ supplied to the pin 10.

The drive amplifier stage 14 includes the Darlington-connected NPN type emitter-follower amplifier transistors $Q_{10}$ and $Q_{11}$ and an NPN type transistor $Q_{14}$ serving as a second constant current source. The output signal of the differential cascade amplifier stage 12 is supplied to the base electrode of the transistor $Q_{10}$ while the emitter electrode of the transistor $Q_{11}$ is connected with the collector electrode of the second constant current source transistor $Q_{14}$ through the series circuit of PN junction type bias diodes $D_1$, $D_2$ and $D_3$ for lowering cross-over distortion. The base electrode of the diode-functioning transistor $Q_{12}$ in the bias circuit network 13 is connected with the base electrode of the first constant current source transistor $Q_5$ in the input differential amplifier stage 11 and also with the base electrode of the second constant current source transistor $Q_{14}$ in the drive amplifier stage 14.

This embodiment shown in FIG. 4 can attain the aimed object of the present invention for the following reason.

When the power switches $SW_1$ and $SW_2$ are both turned on, the voltage $V_4$ at the pin 4 increases exponentially in accordance with the delay time in the delay circuit 17, i.e. the time constant $\tau$ ($\approx R_{103}C_{103}$) of the power source ripple eliminating filter circuit 17. On the other hand, since the bias network 13 has the Zener diodes $ZD_1$ and $ZD_2$ and the bias transistor $Q_{13}$, the dc bias current $I_{B13}$ never flows through the bias circuit network 13 until the voltage $V_4$ at the pin 4 rises up to satisfy the following relation (3).

$$V_4 \geq V_{ZD_1} + V_{ZD_2} + V_{ZD_3} \tag{3}$$

Here, $V_{ZD_1}$, $V_{ZD_2}$ and $V_{ZD_3}$ are the breakdown voltages of the Zener diodes $ZD_1$, $ZD_2$ and $ZD_3$.

After the voltage $V_4$ at the pin 4 has become so high that the relation (3) may be satisfied, a constant dc bias current $I_{B13}$ independent of the change in the power source voltages flows through the bias circuit network 13, the current $I_{B13}$ being given by the following equation (4).

$$I_{B13} = (V_{ZD_3} - V_{BEQ_{13}})/R_9 \tag{4}$$

Here, $V_{ZD_3}$ is the breakdown voltage of the Zener diode $ZD_3$ and $R_9$ is the resistance value of the resistor $R_9$.

Accordingly, while the voltage $V_4$ at the pin 4 is so low immediately after the turn-on of the power sources that the relation (3) may not yet be satisfied, the dc bias current $I_{B13}$ through the bias circuit network 13 is zero. As a result, the base of the diode-functioning transistor $Q_{12}$ is kept substantially at the zero potential. Since the base electrode of the transistor $Q_{12}$ is connected with the base electrode of the first constant current source transistor $Q_5$ in the input differential amplifier stage 11, the current flowing through the collector-emitter path of the transistor $Q_5$ is also zero so long as the dc bias current $I_{B13}$ through the bias circuit network 13 is zero. While the current through the collector-emitter path of the transistor $Q_5$ is zero, the Zener diode $ZD_4$ for eliminating the ripple components in the power sources is cut off. Consequently, the differential pair of transistors ($Q_1$, $Q_2$) and ($Q_3$, $Q_4$) are all maintained cut off so that the dc bias current $I_{B11}$ flowing through the common resistor $R_8$ in the input differential amplifier stage 11 is also zero. Therefore, during the time interval for which the voltage $V_4$ is so low as not to satisfy the relation (3), the input differential amplifier stage 11 is non-responsive to the input signal $V_{IN}$ supplied to the pin 7 through the input coupling capacitor $C_{101}$ and therefore the following stages, i.e. the differential cascade amplifier stage 12, the drive amplifier stage 14 and the push-pull output amplifier stage 15, are all non-responsive to the input signal $V_{IN}$. Thus, the direct coupling type power amplifier circuit as a whole undergoes a muting effect.

Then, when the voltage $V_4$ at the pin 4 becomes so high as to satisfy the relation (3), the bias current $I_{B13}$ starts flowing through the bias circuit network 13 so that current starts flowing through the collector-emitter path of the first constant current source transistor $Q_5$ in the input differential amplifier stage 11. The current through the collector-emitter path of the transistor $Q_5$ flows also into the Zener diode $ZD_4$ to turn the same on. Upon the conduction of the Zener diode $ZD_4$ of eliminating the ripple components in the power sources, the dc bias current $I_{B11}$ given by the following relation (5) flows through the common resistor $R_8$ in the input differential amplifier stage 11.

$$I_{B11} = \frac{V_{ZD_4} - (V_{BEQ_1} + V_{BEQ_2})}{R_8} \tag{5}$$

Here, $V_{ZD_4}$ is the breakdown voltage of the Zener diode $ZD_4$, and $V_{BEQ_1}$ and $V_{BEQ_2}$ are the forward voltage drops across the base-emitter junctions of the transistors $Q_1$ and $Q_2$.

When the dc bias current $I_{B11}$ flows through the common resistor $R_8$, the differential pair of transistors ($Q_1$, $Q_2$) and ($Q_3$, $Q_4$) in the input differential amplifier stage 11 are so biased as to be rendered conductive and therefore the input differential amplifier stage 11 responds to and amplifies the input signal $V_{IN}$ supplied to the pin 7. Then, the differential cascade amplifier stage 12, the drive amplifier stage 14 and the push-pull output amplifier stage 15 are so biased as to be sequentially rendered conductive and therefore they perform their respective amplifying functions.

Figure 5:
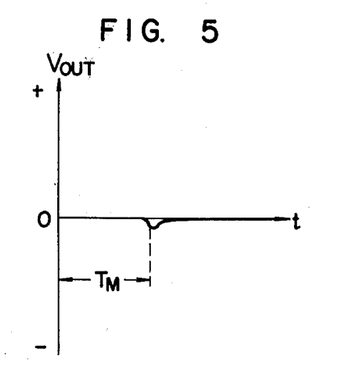
FIGS. 5 and 6 show the changes in the waveforms of the output signals of the direct coupling type power amplifier circuit shown in FIG. 4 after the turn-on of the power source voltages, FIG. 5 corresponding to the case where no input signal is applied to the power amplifier circuit and FIG. 6 corresponding to the case where an input signal is applied to the power amplifier circuit.

FIG. 5 shows the change in the output signal $V_{OUT}$ of the direct coupling type power amplifier circuit shown in FIG. 4, taking place after the turn-on of the power sources in the case where no input signal $V_{IN}$ is applied. During a predetermined time interval substantially determined by the time constant $\tau$ of the filter circuit 17 (or the delay time in the delay circuit 17) and the breakdown voltages $V_{ZD_1}$, $V_{ZD_2}$ and $V_{ZD_3}$ of the Zener diodes $ZD_1$, $ZD_2$ and $ZD_3$, the input differential amplifier stage 11 and the differential cascade amplifier stage 12 of the direct coupling type power amplifier circuit is so biased as to be cut off. Accordingly, no current flows into the base of the transistor $Q_{10}$ in the drive amplifier stage 14 so that the emitter-follower amplifier transistors $Q_{10}$ and $Q_{11}$ remain cut off. Moreover, the base electrode of the diode-functioning transistor $Q_{12}$ is kept at zero potential during the predetermined time interval $T_M$ so that the second constant current source transistor $Q_{14}$ in the drive amplifier stage 14 is kept cut off during the time interval $T_M$. While the emitter-follower amplifier transistors $Q_{10}$, $Q_{11}$ and the second constant current source transistor $Q_{14}$ in the drive amplifier stage 14 are all being cut off, no current flows into the bases of the transistors $Q_{15}$ and $Q_{17}$ of the push-pull output amplifier stage 15. Consequently, the Darlington-connected transistors $Q_{15}$ and $Q_{16}$ and the complementary transistors $Q_{17}$ and $Q_{18}$ are so biased as to be cut off and therefore the voltage of the output signal $V_{OUT}$ at the pin 1 is substantially zero. After the lapse of the time interval $T_M$, all the stages 11, 12, 14 and 15 of the direct coupling type amplifier circuit are so biased as to be sequentially rendered conductive and therefore they start their amplifying operations. As a result, the output signal $V_{OUT}$ at the pin 1 rapidly follows the potential at the pin 7 (kept at the ground potential, i.e. zero potential through the resistor $R_{101}$) after a transient fluctuation due to the negative feedback effect by the negative feedback circuit 16.

Figure 6:
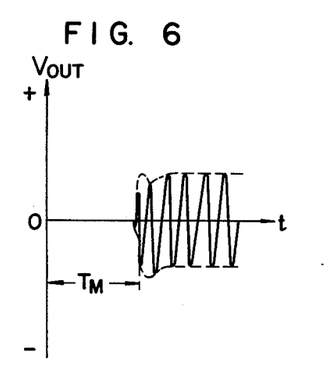

FIG. 6 shows the change in the output signal $V_{OUT}$ of the direct coupling type power amplifier circuit shown in FIG. 4, taking place after the turn-on of the power sources in the case where $V_{IN}$ is applied to the pin 7. It is seen from FIG. 6 that a muting effect takes place for the above-described time interval $T_M$.

In this embodiment shown in FIG. 4, the dc level of the output signal $V_{OUT}$ is kept substantially at zero during and after the predetermined time interval $T_M$ so that the direct coupling type power amplifier circuit itself can be prevented from generating impact or popping sound unpleasant to the ears.

Figure 7:
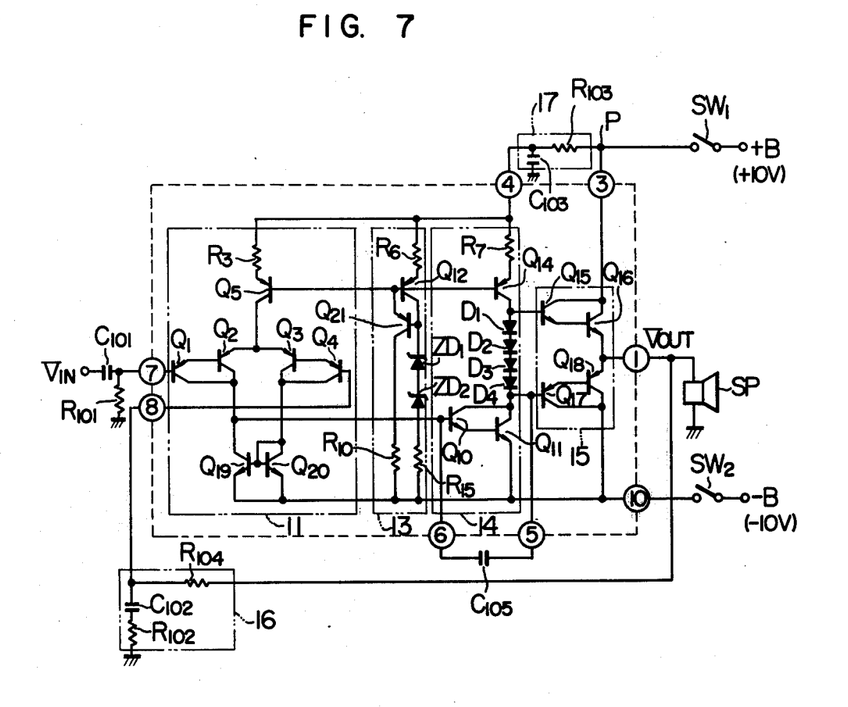
FIG. 7 shows a direct coupling type power amplifier circuit of a two-power OCL system according to a further embodiment of the present invention.

FIG. 7 shows a direct coupling type power amplifier circuit of two-power OCL system, fabricated in monolithic semiconductor integrated circuit configuration in accordance with a further embodiment of the present invention. In FIG. 7, equivalent circuit components and blocks are indicated by the same reference numerals or symbols as in FIG. 4, and the description of the parts already mentioned is omitted and only parts different from FIG. 4 will be detailed.

In the power amplifier circuit shown in FIG. 7, the input differential amplifier stage 11 includes a differential pair of Darlington-connected PNP type transistors ($Q_1$, $Q_2$) and ($Q_3$, $Q_4$). The emitter electrodes of the transistors $Q_2$ and $Q_3$ are connected in common with the collector electrode of the first constant current source transistor $Q_5$. The collector electrodes of the transistors $Q_1$ and $Q_2$ are connected in common with the collector electrode of a load transistor $Q_{19}$ while the collector electrodes of the transistors $Q_3$ and $Q_4$ are connected in common with the collector electrode of a load transistor $Q_{20}$. The base electrodes of the load transistors $Q_{19}$ and $Q_{20}$ are connected in common with the collector electrode of the load transistor $Q_{20}$.

The drive amplifier stage 14 includes the Darlington-connected grounded-emitter amplifier transistors $Q_{10}$ and $Q_{11}$. Since the base electrode of the transistor $Q_{10}$ is connected with the collector electrode of the load transistor $Q_{19}$ in the input differential amplifier stage 11, the drive amplifier stage 14 responds to the output signal of the input differential amplifier stage 11 dc-wise and ac-wise, i.e. irrespective of whether the output is of dc or ac. The collector electrodes of the Darlington-connected emitter-grounded amplifier transistors $Q_{10}$ and $Q_{11}$ are connected in common with the base electrode of the PNP transistor $Q_{17}$ in the push-pull output amplifier stage 15 and also with the base electrode of the NPN transistor $Q_{15}$ in the push-pull output amplifier stage 15 through a series circuit of PN junction type bias diodes $D_1$, $D_2$, $D_3$ and $D_4$ for lowering cross-over distortion. The base electrode of the transistor $Q_{15}$ is connected with the collector electrode of a PNP type constant current load transistor $Q_{14}$ provided to serve as a load for the grounded-emitter amplifier transistors $Q_{10}$ and $Q_{11}$. The push-pull output amplifier stage 15 is in the form of a pure complementary push-pull output circuit including Darlington-connected NPN type transistors $Q_{15}$ and $Q_{16}$ and Darlington-connected PNP type transistors $Q_{17}$ and $Q_{18}$.

The bias circuit network 13 is a series circuit of a bias resistor $R_5$, series-connected Zener diodes $ZD_1$ and $ZD_2$ and a diode-functioning transistor $Q_{12}$ with its collector electrode connected with its base electrode through the base-emitter junction of a bias transitor $Q_{21}$. The diode-functioning transistor $Q_{12}$ has its emitter electrode connected with the pin 4 through a resistor $R_6$ and its base electrode connected with the base electrode of the first constant current source transistor $Q_5$ in the input differential amplifier stage 11 and also with the base electrode of the constant current load transistor $Q_{14}$ in the drive amplifier stage 14.

With this embodiment shown in FIG. 7, too, a muting effect takes place during the predetermined time interval $T_M$ for which the voltage $V_4$ at the pin 4 after the turn-on of the power sources in the presence of the input signal $V_{IN}$ is not so high as to satisfy the following relation (6).

$$V_4 \geq V_{BEQ_{12}} + V_{BEQ_{21}} + V_{ZD_1} + V_{ZD_2} \tag{6}$$

Since the constant current load transistor $Q_{14}$ and Darlington-connected grounded-emitter amplifier transistors $Q_{10}$ and $Q_{11}$ in the drive amplifier stage 14 are all kept cut off during the time interval $T_M$, the direct coupling type power amplifier circuit itself can be prevented from generating popping sound unpleasant to the ears.

Moreover, since the muting time $T_M$ is set to be 1 second to 2 seconds in the foregoing embodiments of the present invention, the amplifying function of the power amplifier circuit is initiated only after the undesirable fluctuation of the output of such a preamplifier circuit as an equalizer connected in a first stage of the power amplifier circuit has ceased, the fluctuation taking place immediately after the turn-on of the power source.

Concerning the embodiment shown in FIG. 4, the delay time in the delay circuit 17, i.e. the time constant $\tau$ of the power source ripple filter circuit 17 is set to be about 2 seconds and the breakdown voltages $V_{ZD_1}$, $V_{ZD_2}$ and $V_{ZD_3}$ of the Zener diode $ZD_1$, $ZD_2$ and $ZD_3$ are 5.6 volts. In order to maintain the voltage $V_4$ at the pin 4 at 16.8 volts, therefore, it is necessary to set the muting time $T_M$ to be at least 1.5 seconds. After the lapse of the time $T_M$, the direct coupling type power amplifier circuit initiates its amplifying function.

Numerous variations may be made without departing from the spirit of the present invention.

For example, the Zener diodes $ZD_1$, $ZD_2$ and $ZD_3$ used as constant voltage means may be replaced vy a plurality of forward series-connected PN junction type diodes to develop a desired constant voltage across them.

Moreover, the delay circuit 17 is not limited to the power source ripple eliminating filter circuit constructed by the resistor $R_{103}$ and the capacitor $C_{103}$, but may be replaced by any circuit that allows the voltage $V_4$ at the pin 4 to gradually increase after a desired delay time in response to the rapid rise in the voltage at the first power source voltage supply point P due to the turn-on of the power switch $SW_1$.

Further, the differential pair of transistors $(Q_1, Q_2)$ and $(Q_3, Q_4)$ in the input differential amplifier stage 11 may be replaced by N-channel MOSFETs with their source electrodes connected in common in a differential fashion.

We claim:

1. A direct coupling type power amplifier circuit comprising:
    an input differential amplifier stage having first and second input electrodes, an input signal being supplied to said first input electrode;
    a drive amplifier stage responsive to the output signal of said input differential amplifier stage dc-wise and ac-wise;
    a push-pull output amplifier stage responsive to the output signal of said drive amplifier stage dc-wise and ac-wise;
    a negative feedback circuit network coupled between said push-pull output amplifier stage and said second input electrode of said input differential amplifier stage, the output of said push-pull output amplifier stage being supplied to said second input electrode of said input differential amplifier stage through said negative feedback circuit network;
    a bias circuit network coupled with said input differential amplifier stage for defining the dc bias current through said input differential amplifier stage, said bias circuit network including constant voltage means for providing a constant voltage; and
    a delay circuit means coupled between said bias circuit network and a first power source voltage supply point to which a first power source voltage is supplied, said delay circuit means providing a predetermined delay time,
    whereby the dc bias current through said input differential amplifier stage is cut off to hold the whole power amplifier circuit non-responsive to said input signal supplied to said first input electrode of said input differential amplifier stage during a predetermined time interval after the application of said first power source voltage to said first power source voltage supply point, said predetemined time interval being substantially determined by the delay time of said delay circuit means and the constant voltage of said constant voltage means in said bias circuit network.

2. A direct coupling type power amplifier circuit according to claim 1, wherein said input differential amplifier stage includes a differential pair of amplifier means and a first constant current source transistor, one of the differential paired amplifier means having said first input electrode, a common electrode and an output electrode, the other of the differential paired amplifier means having said second input electrode, a common electrode and an output electrode, and said common electrodes of said differential paired amplifier means being connected together, and wherein said bias circuit network includes bias resistor means and PN junction type diode means connected in series with said constant voltage means, an electrode of said PN junction type diode means being connected with the base electrode of said first constant current source transistor to provide a bias current to the same transistor.

3. A direct coupling type power amplifier circuit according to claim 2, wherein said differential pair of amplifier means in said input differential amplifier stage compise a differential pair of transistor means of a first conductivity type.

4. A direct coupling type power amplifier circuit according to claim 3, further comprising a differential cascade amplifier stage including a differential pair of transistors of a second conductivity type, said differential cascade amplifier stage responding to the output signal of said input differential amplifier stage dc-wise and ac-wise and driving said drive amplifier stage dc-wise or ac-wise.

5. A direct coupling type power amplifier circuit according to claim 4, wherein the collector electrodes of said differential pair of first conductivity type transistor means in said input differential amplifier stage are connected respectively with one end of a first load resistor and one end of a second load resistor, the other ends of said first and second load resistors being connected together, and the emitter electrodes of said differential pair of second conductivity type transistors in said differential cascade amplifier stage are connected in common with one end of an emitter common resistor having the other end thereof connected through a temperature compensating PN junction type diode with a junction point of said other end of said first and second load resistors.

6. A direct coupling type power amplifier circuit according to claim 3, wherein each of said differential pair of first conductivity type transistor means in said input differential amplifier stage comprises Darlington-connected transistors.

7. A direct coupling type power amplifier circuit according to claim 3, wherein said drive amplifier stage includes grounded-emitter amplifier transistor means of a second conductivity type and constant current load transistor means of said first conductivity type, the base electrode of said grounded-emitter amplifier transistor means being applied with the output of said input differential amplifier stage, the collector electrode of said grounded-emitter amplifier transistor means being connected with the collector electrode of said constant current load transistor means, and the base electrode of said constant current load transistor means being connected with said PN junction type diode means in said bias circuit network.

8. A direct coupling type power amplifier circuit according to claim 7, wherein the collector electrode of said grounded-emitter transistor means is connected with the collector electrode of said constant current load transistor means through bias means for lowering cross-over distortion.

9. A direct coupling type power amplifier circuit according to claim 2, wherein said bias circuit network further includes a bias transistor connected with a second power source voltage supply point to which a second power source voltage is supplied whereby the dc bias current through said input differential amplifier stage is cut off during said predetermined time interval after the application of said first and second power source voltages to said first and second power source voltage supply points.

10. A direct coupling type power amplifier circuit according to claim 9, wherein said first constant current source transistor in said input differential amplifier stage is of said first conductivity type, and said bias transistor in said bias network is of said second conductivity type, the emitter electrode of said bias transistor being connected with said delay circuit through said constant voltage means and said bias resistor means, the base electrode of said bias transistor being connected with a ground potential point, and the collector electrode of said bias transistor being connected with said second power source voltage supply point through said PN junction type diode means.

11. A direct coupling type power amplifier circuit according to claim 10, wherein the common electrodes of said differential pair of amplifier means in input differential stage is connected through common impedance means with the collector electrode of said first constant current source transistor, the collector electrode of said first constant current source transistor being connected with the ground potential point.

12. A direct coupling type power amplifier circuit according to claim 10, wherein the emitter electode of said bias transistor is connected through a resistor with the series circuit of said bias resistor means and said constant voltage means, and the series circuit of said resistor and the emitter-base junction of said bias transistor is shunted by constant voltage means for improving the characteristic of voltage decrease.

13. A direct coupling type power amplifier circuit according to claim 10, wherein said differential pair of amplifier means in said input differential amplifier stage comprise a differential pair of transistor means of a first conductivity type.

14. A direct coupling type power amplifier circuit according to claim 13, further comprising a differential cascade amplifier stage including a differential pair of transistors of a second conductivity type, wherein said differential cascade amplifier stage responding to the output signal of said input differential amplifier stage dc-wise and ac-wise and driving said drive amplifier stage.

15. A direct coupling type power amplifier circuit according to claim 14, wherein the collector electrodes of said differential pair of first conductivity type transistor means in said input differential amplifier stage are connected respectively with one end of a first load resistor and one end of a second load resistor, the other ends of said first and second load resistors being connected together, and the emitter electrodes of said differential pair of second conductivity type transistors in said differential cascade amplifier stage are connected in common with one end of an emitter common resistor having the other end thereof connected through a temperature compensating PN junction type diode with a junction point of said other ends of said first and second load resistors.

16. A direct coupling type power amplifier circuit according to claim 13, wherein each of said differential pair of first conductivity type transistor means in said input differential amplifier stage comprises Darlington-connected transistors.

17. A direct coupling type power amplifier circuit according to claim 14, wherein said drive amplifier stage includes emitter-follower amplifier transistor means of said first conductivity type and a second constant current source transistor of said first conductivity type, the base electrode of said emitter-follower amplifier transistor means being applied with the output of said input differential amplifier stage, the emitter electrode of said emitter-follower amplifier transistor means being connected with the collector electrode of said second constant current source transistor, and the base electrode of said second constant current source transistor being connected with said PN junction type diode means in said bias circuit network.

18. A direct coupling type power amplifier circuit according to claim 10, wherein the emitter electrode of said emitter-follower amplifier transistor means is connected with the collector electrode of said second constant current source transistor through bias means for lowering cross-over distortion.

19. A direct coupling type power amplifier circuit according to claim 9, wherein the collector and base electrodes of said PN junction type diode means in said bias circuit network are connected with each other through the base-emitter junction of said bias transistor, the collector electrode of said bias transistor being connected with said second power source voltage supply point.

* * * * *